(12) United States Patent
Petersen et al.

(10) Patent No.: US 8,058,886 B2
(45) Date of Patent: Nov. 15, 2011

(54) DEVICE INCLUDING A CONTACT DETECTOR

(75) Inventors: Dirch H. Petersen, Dyssegard (DK); Rong Lin, Kokkedal (DK)

(73) Assignee: Capres A/S, Lynby (DK)

( * ) Notice: Subject to any disclaimer, the term of this patent is extended or adjusted under 35 U.S.C. 154(b) by 204 days.

(21) Appl. No.: 12/531,024

(22) PCT Filed: Mar. 12, 2008

(86) PCT No.: PCT/DK2008/000100
§ 371 (c)(1),
(2), (4) Date: Dec. 23, 2009

(87) PCT Pub. No.: WO2008/110174
PCT Pub. Date: Sep. 18, 2008

(65) Prior Publication Data
US 2010/0141291 A1 Jun. 10, 2010

(30) Foreign Application Priority Data
Mar. 12, 2007 (EP) .................................... 07388012

(51) Int. Cl.
*G01R 31/20* (2006.01)
*G01R 1/067* (2006.01)
(52) U.S. Cl. .......... 324/754.01; 324/755.11; 324/755.07
(58) Field of Classification Search .. 324/754.01–754.1, 324/762.01–762.1, 755.01–755.11, 756.01–756.04; 257/48; 438/14–18
See application file for complete search history.

(56) References Cited

U.S. PATENT DOCUMENTS

| 5,266,801 A | 11/1993 | Elings et al. |
| 5,907,095 A | 5/1999 | Lin |

(Continued)

FOREIGN PATENT DOCUMENTS

JP 2006284599 10/2006
(Continued)

OTHER PUBLICATIONS

International Search Report on related PCT application (PCT/DK2008/000100) from International Searching Authority (EPO) dated Jun. 4, 2008.

*Primary Examiner* — Huy Q Phan
*Assistant Examiner* — Tung X. Nguyen
(74) *Attorney, Agent, or Firm* — Klein, O'Neill & Singh, LLP (57) ABSTRACT

The present invention relates to a probe for determining an electrical property of an area of a surface of a test sample, the probe is intended to be in a specific orientation relative to the test sample. The probe may comprise a supporting body defining a first surface. A plurality of cantilever arms (12) may extend from the supporting body in co-planar relationship with the first surface. The plurality of cantilever arms (12) may extend substantially parallel to each other and each of the plurality of cantilever arms (12) may include an electrical conductive tip for contacting the area of the test sample by movement of the probe relative to the surface of the test sample into the specific orientation. The probe may further comprise a contact detector (14) extending from the supporting body arranged so as to contact the surface of the test sample prior to any one of the plurality of cantilever arms (12) contacting the surface of the test sample when performing the movement.

17 Claims, 3 Drawing Sheets

U.S. PATENT DOCUMENTS

| | | |
|---|---|---|
| 6,148,622 A | 11/2000 | Sanger |
| 6,621,080 B2 | 9/2003 | Yamamoto |
| 6,953,519 B2 | 10/2005 | Shirakawabe et al. |
| 7,063,541 B2 * | 6/2006 | Grube et al. ............ 439/66 |
| 7,304,486 B2 * | 12/2007 | Petersen et al. ........ 324/755.01 |
| 2002/0153909 A1 | 10/2002 | Petersen et al. |
| 2004/0056674 A1 | 3/2004 | Petersen et al. |

FOREIGN PATENT DOCUMENTS

| | | |
|---|---|---|
| WO | WO 2005/124371 | 12/2005 |

* cited by examiner fig. 1 fig. 2

Fig. 3

Fig. 4 fig. 5

DEVICE INCLUDING A CONTACT DETECTOR

CROSS-REFERENCE TO RELATED APPLICATION

This application is a national phase filing, under 35 U.S.C. §371(c), of International Application No. PCT/DK2008/000100, filed 12 Mar. 2008, the disclosure of which is incorporated herein by reference in its entirety.

FEDERALLY SPONSORED RESEARCH OR DEVELOPMENT

Not Applicable

BACKGROUND

The present invention relates to a probe for determining an electrical property of a test sample. The present invention further relates to a method of determining an electrical property of a test sample. The present invention still further relates to a system for determining an electrical property of a test sample.

Probes, methods and systems for determining electrical properties of test samples have been described in publications such as US 2004/0056674, US 2002/0153909, WO 2005/124371, U.S. Pat. No. 5,266,801, U.S. Pat. No. 6,621,080, U.S. Pat. No. 5,907,095, U.S. Pat. No. 6,953,519, U.S. Pat. No. 6,148,622 and JP2006/284599. Reference is made to all of the above US patent publications, all of which are hereby incorporated in the present description by reference.

When using a probe having one or more cantilever arms extending therefrom, there is always the risk of damaging the cantilever arms when bringing the probe into contact with the intended part of the surface of the test sample. The assumption is that the surface of the test sample is substantially planar and that the test probe is maintained in an orientation that is perfectly aligned relative to the surface of the test sample. In reality, the surface may have bumps, depositions, grooves, holes or other deformities or imperfections that may potentially damage or cause the probe to be extensively worn. Also, the probe is usually mounted in a holder in a test apparatus or system, while the test sample is mounted in a corresponding test sample holder. If the probe is misaligned relative to the test sample surface the movement of the probe towards the probe surface may cause damage to one or more probe arms.

SUMMARY

It is therefore an object of the present invention to provide a method of obtaining an electrical property of a test sample, while providing detection of the surface of the test sample so that damage to the probe is limited or avoided. It is a further object of the present invention to provide a probe for determining an electrical property of a test sample where the probe includes a contact detector. It is a still further object of the present invention to provide a system for determining an electrical property of a test sample wherein the system uses a probe according to the teachings of the present invention.

In JP2006/284599 a device for testing electrical properties of circuits is disclosed. The device constitutes several cantilevers extending in the same direction from a support body. The cantilevers are of two different lengths, where the longer are used as contact detectors, and the shorter for measuring an electrical property of a test sample. Also, JP2006/284599 discloses an electrical pathway of a piezoresistive material in the long cantilevers, and that the long cantilevers can generate a signal indicating the deflection upon contact with the test circuit.

The piezoresistive effect, where the electrical resistance changes with an applied mechanical stress, depends on the applied force and the geometry of the piezoresistive material. The change in resistance with respect to the applied force is known to be non-linear. It is also known that, under favourable circumstances, the corresponding non-linearity in the resulting detection signal can be compensated for by electronic or digital means.

However, there is an inherent problem with contact detectors based on cantilevers, or flexible arms, and piezoresistive materials, which concerns the directionality of the applied force. Both the direction and the magnitude of the force influence the detection signal, which means that it is not possible to distinguish between these two parameters from the detection signal alone. This means that two forces with different magnitudes and directions can give the same detection signal.

When detecting the distance along the normal to two planar test surfaces, where one is smooth and the other is uneven with grooves and bumps, even though the deflections of the flexible arms along normal are the same, the detection signals may differ due to the fact that for the uneven surface there can also be a force component in the plane of the surface, as a result of the grooves and bumps, while this force component is absent for the smooth surface. This may cause the contact detector to give a signal that, from prior calibrations, indicates that the cantilevers for determining the electrical property are in contact with the test sample, even though this is not the case. Clearly, the accuracy of a distance measurement, and the associated determination of the electrical property of a test sample, can be improved if the contact detectors are made insensitive to forces perpendicular to the surface normal.

Therefore, another object of this invention is to provide a contact detector that gives a better determination of the distance to a test surface, which is achieved in part by avoiding piezo-resistive materials in the electrical pathway of the flexible arm of the contact detector.

The above objects are obtained by the present invention, which in a first aspect relates to a probe for determining an electrical property of an area of a surface of a test sample, the probe intended to be in a specific orientation relative to the test sample, the probe comprising:

a supporting body defining a first surface,
a plurality of cantilever arms extending from the supporting body in co-planar relationship with the first surface, the plurality of cantilever arms extending substantially parallel to each other, each of the plurality of cantilever arms including an electrical conductive tip for contacting the area of the test sample by movement of the probe relative to the surface of the test sample into the specific orientation, and
a contact detector extending from the supporting body arranged so as to contact the surface of the test sample prior to or simultaneously with any one of the plurality of cantilever arms contacting the surface of the test sample when performing the movement, where said contact detector is a strain gauge sensor comprising:
a flexible arm split at its base in two anchoring arms, and an electrical pathway of a non-piezoresistive material going out through one of the anchoring arms to the flexible arm and back through the other of the anchoring arms.

In the present specification the term piezoresistivity is defined in accordance with the general definition of piezoresistivity as follows: In a wire of a length l, the wire will exhibit a differential change in the resistivity under mechanical strain or deformation along the wire axis as defined:

$$\frac{dR}{R} = (1+2v)\frac{dl}{l} + \frac{d\rho}{\rho} \text{ with } \varepsilon_l = \frac{dl}{l},$$

where R is the resistance, p is the resistivity, v is the Poisson ratio.

On this basis the so-called gauge factor is defined as follows:

$$\text{The gauge factor} = \frac{dR/R}{\varepsilon_l} = \frac{d\rho/\rho}{\varepsilon_l} + (1+2v)$$

The gauge factor includes two terms.

$$\text{The first term} = \frac{dR/R}{\varepsilon_l}$$

and the second term 1+2 v.

The first term is called the piezoresistive effect and the second term is called the geometric effect.

In the present context a material is considered to be a piezoresistive material provided the piezoresistive effect, i.e. the first term is dominating relative to the second term, i.e. to the geometric effect, whereas a material is considered to be non-piezoresistive provided the second term, i.e. the geometrical effect is dominating relative to the first term, i.e. the piezoresistive effect.

Generally speaking, most metals exhibit a low gauge factor, typically approximately 2 and further have a low piezoresistive effect. Relevant metals to be used in the context of the present invention are Ni, Au, Ru, Ti, Cu, Al, Ag, Co, Cr, Mb, Fe, Pt and alloys thereof.

Relevant piezoresistive materials to be used in the context of the present invention are semiconductor materials, which typically have a gauge factor with numerical value of approximately 200 and examples of relevant semiconductor materials are p and n type Ge, p and n type InSb and p and n type Si.

The supporting body, cantilever arms and contact detector are in the presently preferred embodiment all made from the same starting material, e.g. produced from a single semiconductor material block, preferably the material is silicon. The cantilever arms and the contact detector may be formed using etching, photolithographic methods, or any other methods.

In an advantageous embodiment of the present invention, the cantilever arms have a polygonal-shaped cross-section, such as a substantially rectangular-shaped cross-section. The first surface of the supporting body is preferably planar or substantially planar. Each of the cantilever arms are preferably on a plane coplanar with the first surface, or on a plane parallel to the first surface.

The cantilever arms are preferably positioned apart from one another. The spacing between neighbouring cantilever arms is preferably the same for all. In alternative embodiments the spacing may be varying, e.g. within an interval. The spacing is in the presently preferred embodiment measured perpendicular to the lengthwise direction of the cantilever arms.

In the presently preferred embodiment of the invention, each of the cantilever arms includes an electrically conductive tip. Also, each of the cantilever arms includes electrically conductive pathways for establishing electrical communication between a tip and a test apparatus including a signal generator and/or a signal detector. The tips are to be brought into contact with the area on the surface of the test sample on which the electrical property is to be determined.

The presently preferred way of employing the probe according to the first aspect of the invention is by an apparatus where the probe is mounted in a movable holder and moved to be brought into contact with the surface of the test sample. The probe is intended to be placed in the holder so that the electrical conductive tips are brought into contact with the surface of the test sample at approximately the same time. However, the probe may be misaligned or slightly incorrectly placed in the holder, or the holder may have drifted relative to some previously measured calibration value, or for any other reason. The test sample is preferably also mounted in a holder. The holder for the test sample is preferably not movable. The position of the test sample may also be a source for misalignment of the probe relative to the test sample.

If the probe and the test sample have relative positions that are different from what is expected, it is possible that the movement of the probe relative to the test sample may cause damage to the cantilever arms, e.g. if the cantilever arms are closer to the surface than expected. Also, the cantilever arms may be damaged if the surface of the test sample has a deposition of material or some other unexpected surface defect. The use of a probe according to the teachings of the present invention wherein the probe include a contact detector is very advantageous compared to probes not having such a contact detector.

In the presently preferred embodiment the contact detector comprises a strain gauge sensor. The strain gauge is sometime referred to as a strain gage. The strain gauge is based on the effect that the electrical resistance of some materials changes when they are deformed, i.e. subjected to strain. A strain gauge can be used to convert force, pressure, tension and/or weight into a change into an electrical resistance, which then can be measured. As a technical term, "strain" includes both tensile and compressive strain, distinguished by a positive or negative sign. Thus, strain gauges can be used to determine expansion as well as contraction.

When the probe is brought into contact with the surface of the test sample as described above, and the contact detector comprises one of the above mentioned sensor means, the sensor or sensor means may detect deflection, bending or deformation of the contact detector. This deformation or deflection of the contact detector is an indication that the probe is near or at the surface of the test sample. Also, it may be an indication that the probe, and in particular the cantilever arms, are near the surface and/or an unexpected surface defect.

Further, the probe may further include electrical detection circuit for detecting signal change in the contact detector.

In a particularly advantageous embodiment of the present invention the contact detector may be a flexible cantilever arm and the surface of the test sample may be detected by measuring deflection of the flexible cantilever arm. The contact detector may then indicate the presence of a surface or surface defect by the deflection of the cantilever arm. The degree of deflection may also give an indication of the force between the probe arms and the surface or surface defect.

In one embodiment of the present invention the electrical detection circuit comprises a Wheatstone bridge or alternatively a four-wire ohm circuit. The Wheatstone bridge may be used to measure change in resistance in the strain gauge, thereby giving a measure of the deflection of the flexible arm of the contact detector. Any other circuit for determining resistance or changes in resistance may also be used.

According to the teachings of the present invention, the contact detector may extend at a specific angle relative to the plurality of cantilever arms. As mentioned above, the plurality of cantilever arms extend in a substantially parallel direction from the supporting body. The contact detector preferably also extend from the supporting body, and may extend in a direction whereby a specific angle is defined between the direction defined by the parallel extending cantilever arms and the contact detector. In specific embodiments of the probe according to the first aspect of the present invention the specific angle may be 0 degrees, 45 degrees or 90 degrees. At 0 degrees the contact detector extends substantially parallel to the plurality of cantilever arms. At 90 degrees the contact detector extends substantially perpendicular to the plurality of cantilever arms. The angle defined by the contact detector and the cantilever arms may optionally by any angle in the interval 0 to 180 degrees. The angle is preferably defined in the same plane as the first surface of the supporting body.

In a further specific embodiment of the present invention each of the cantilever arms may extend so as to define a first length from the body, the contact detector may extend from the body so as to define a second length being different from the first length. In one further embodiment the second length may be greater than the first length and in an alternative embodiment the second length may be shorter than the first length. The cantilever arms each define lengths within a specific length interval. The specific length interval is preferably narrow compared to the average length of the cantilever arms. In certain embodiments the cantilever arms may, however, define different lengths with greater variation. E.g. the plurality of cantilever arms may be divided into two or more groups, where each group defines lengths within a group length interval, and each group length interval is different. Similarly, the contact detectors may also be divided into groups, where each group defines a length within a unique interval.

In order to provide a distinct change of the resistance of the contact detector, the flexible arm split preferably defines an arm split aperture defining an arm split length along the longitudinal direction of the contact detector, which arm split length advantageously constitutes a specific percentage of the overall length of the contact detector, such as a percentage of 10-99%, 15-75%, 20-30% or 25-40%, or alternatively 10-15%, 15-20%, 20-25%, 25-30%, 30-35%, 35-40%, 40-45%, 45-50%, 50-55%, 55-60%, 60-65%, 65-70%, 70-75%, 75-80%, 80-85%-85-90%, 90-95%, 95-99%.

The present technique basically relates to small size probes and the first length and/or the second length consequently preferably is or are of the order 1 µm-1000 µm, e.g. 2 µm-500 µm, such as 5 µm-100 µm or alternatively 1 µm-5 µm, 5 µm-20 µm, 25 µm-50 µm, 50 µm-75 µm, 75 µm-100 µm, 100 µm-150 µm, 150 µm-200 µm, 200 µm-300 µm, 300 µm-500 µm, 500 µm-1000 µm.

It is contemplated that an embodiment where the contact detector defines a length being greater than the length defined by the longest cantilever arm is particularly advantageous. In such an embodiment, it is contemplated that the contact detector reaches the surface before any of the cantilever arms.

In a further embodiment, the plurality of cantilever arms may define a common plane. The common plane defined by the cantilever arms is preferably parallel to the plane defined by the first surface of the supporting body. In an alternative embodiment, the arms do not define a common plane, e.g. the cantilever arms are displaced in a direction along the normal of the first plane of the supporting body.

In a particular advantageous embodiment the contact detector may be embedded on a second planar surface, the second surface being in the common plane or, alternatively, the second surface being in a plane displaced parallel to the common plane. The surface of the contact detector may be placed so that a distance is defined between the common plane of the cantilever arms and the plane of the contact detector, where the distance is measured along the shared normal of the two parallel planes.

Generally, the probe may be fabricated using Microelectromechanical systems (MEMS) or Nanoelectromechanical systems (NEMS) fabrication techniques. The probe according to the teachings of the present invention may be produced using any technique used for producing micro- or nanodevices, or other techniques used for producing even smaller devices.

In specific embodiments of the present invention, the contact detector may be positioned between two of the cantilever arms. In other embodiments, the cantilevers may be positioned closely together and the contact detector positioned at a distance from the plurality of cantilever arms. In a special embodiment, the cantilever arms and the contact detector may be positioned in a configuration with two cantilever arms at either side of a contact detector.

In further embodiments, the probe may comprise two contact detectors positioned parallel so that the plurality of cantilever arms is positioned between the two contact detectors. Alternatively, several groups of cantilever arms may be placed in sequence with a contact detector between each group. The number of cantilever arms in each group may vary. Note that empty groups and those with only one element are included in the definition of group used here. More generally, any combination of cantilevers and contact detectors may be used to fit a specific test.

In a specifically preferred embodiment of the probe according to the first aspect of the present invention, constituting a variant of the integral probe including a Wheatstone bridge, the one branch of the Wheatstone bridge including the contact detector further comprises a further contact detector, constituting a reference detector concealed by the supporting body for preventing the reference detector from being contacted with the surface of the test sample. By providing the two resistors of the first branch of the Wheatstone bridge, which first branch includes the contact detector, by replicating the contact detector as a dummy or reference resistor, it is advantageously ensured that the two resistors of the first branch of the Wheatstone bridge are to any substantial extent of identical structure and also identical physical property, i.e. of identical resistivity. The identity between the two resistors of the first branch of the Wheatstone bridge including the contact detector further provides the advantage as far as the process of producing the probe is concerned that the two resistors are produced in identical process steps, simplifying the process of producing the integral probe including the Wheatstone bridge circuitry.

In order to increase the sensitivity of the Wheatstone bridge, it is preferred that the first branch of the Wheatstone bridge, which branch includes the contact detector and optionally and advantageously also the reference detector constituted by a replica of the contact detector has a resistance smaller than the resistance of the second branch, which branch includes reference resistors, which increased pr improved sensitivity is obtained by providing the resistance of the second branch larger than the resistance of the first branch. Consequently, in accordance with the advantageous embodiment including a lower resistance first branch as compared to the second branch, the resistance of the first branch is at least two times, preferably at least one order of magnitude of power of 10 smaller than the resistance of the second branch.

A second aspect of the present invention relates to a method of obtaining an electrical property of a test sample, the method comprising:
 providing the test sample, the test sample defining a test surface,
 providing a test apparatus including a probe for determining an electrical property of an area of a surface of a test sample, the probe intended to be in a specific orientation relative to the test sample, the probe comprising:
 a supporting body defining a first surface,
 a plurality of cantilever arms extending from the supporting body in co-planar relationship with the first surface, the plurality of cantilever arms extending substantially parallel to each other, each of the plurality of cantilever arms including an electrical conductive tip for contacting the area of the test sample by movement of the probe relative to the surface of the test sample into the specific orientation, and
 a contact detector extending from the supporting body arranged so as to contact the surface of the test sample prior to or simultaneously with any one of the plurality of cantilever arms contacting the surface of the test sample when performing the movement,
 the apparatus further comprising an electrical signal generator electrically connected to the electrical conductive tips of the probe,
 providing a contact detection circuit electrically connected to the contact detector,
 moving the probe relative to the surface of the test sample, monitoring the contact detection circuit for indication of the contact detector being in contact with the surface of the test sample, where said contact detector is a strain gauge sensor comprising:
 a flexible arm split at its base in two anchoring arms, and an electrical pathway of a non-piezoresistive material going out through one of the anchoring arms to the flexible arm and back through the other of the anchoring arms.

The second aspect of the present invention thus relates to a method of measuring, determining or obtaining an electrical property of a test sample using a probe according to the first aspect of the present invention.

The method includes monitoring a signal generated by the contact detector. The signal from the contact detector may then be used to determine if an obstacle, e.g. the surface of the test sample or a defect on the surface of the test sample, is nearing the cantilever arms. This monitoring may include transmitting an electrical signal through a sensor on the surface of the contact detector. In a special embodiment the sensor may be a strain gauge and the deflection of the contact detector may be determined using a Wheatstone bridge.

In general, the method according to the second aspect incorporates a probe having any of the features of the probe according to the first aspect of the present invention.

In a third aspect, the present invention further relates to a system for determining an electrical property of an area of a surface of a test sample, the system comprising:
 a test sample holder for holding the test sample,
 a probe holder for holding a probe for determining an electrical property of an area of a surface of a test sample, the probe intended to be in a specific orientation relative to the test sample, the probe comprising:
 a supporting body defining a first surface,
 a plurality of cantilever arms extending from the supporting body in co-planar relationship with the first surface, the plurality of cantilever arms extending substantially parallel to each other, each of the plurality of cantilever arms including an electrical conductive tip for contacting the area of the test sample by movement of the probe relative to the surface of the test sample into the specific orientation, and
 a contact detector extending from the supporting body arranged so as to contact the surface of the test sample prior to or simultaneously with any one of the plurality of cantilever arms contacting the surface of the test sample when performing the movement,
 the system further comprising an electrical signal generator electrically connected to the electrical conductive tips of the probe, and a contact detection circuit electrically connected to the contact detector,
 when moving the probe relative to the surface of the test sample the contact detection circuit detects indication of the contact detector being in contact with the surface of the test sample, where said contact detector is a strain gauge sensor comprising:
 a flexible arm split at its base in two anchoring arms, and an electrical pathway of a non-piezoresistive material going out through one of the anchoring arms to the flexible arm and back through the other of the anchoring arms.

The system according to the third aspect of the present invention may be used for performing the method according to the second aspect of the present invention and may include a probe according to the first aspect. The probe may include any of the features mentioned in relation to the first or second aspect of the present invention.

When using a probe according to the basic teachings of the present invention, it is a particular advantage that, when approaching a surface with such a cantilever-based device, one or more cantilevers of the surface contact detector will be deflected upon impact with the surface. The deflection will result in a change in the measured electrical signal so that the position of the object surface will be detected in at least one dimension. Consequently, the position of the multi-cantilever probe relative to the surface can be well determined with a great accuracy, presently better than ±2 µm in at least one dimension.

In the presently preferred embodiment of the present invention, the multi-cantilever probe is positioned such that the separation between the probe and the surface detection sensor is well controlled, with an accuracy of better than ±2 µm in at least one dimension. This can be realized by fabricating the probe and the sensor on the same substrate (of e.g. silicon, quartz, a ceramic or a polymer) or on two substrates assembled by a self-alignment or a high accuracy packaging technique. The high positioning accuracy can be achieved using MEMS or NEMS fabrication techniques.

BRIEF DESCRIPTION OF THE DRAWINGS

The above mentioned advantages and aspects are now to be disclosed in relation to an embodiment of the present invention with reference to the figures, in which.

DETAILED DESCRIPTION

Figure 1:
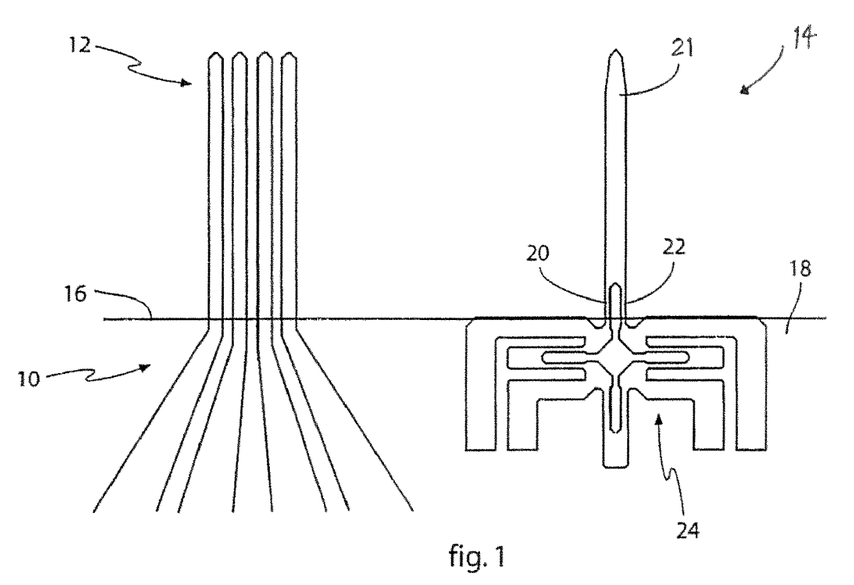
FIG. 1 schematically illustrates a first embodiment of a probe having four cantilever arms and a contact detector, FIG. 2 schematically illustrates a second embodiment of a probe having four cantilever arms and two contact detectors, FIG. 3 schematically illustrates sketch of a strain gauge in a Wheatstone bridge configuration, FIG. 4 schematically illustrates measured output voltage of a Wheatstone bridge as a function of the displacement of the strain sensor, i.e. surface detector, and FIG. 5 schematically illustrates a third embodiment of the probe.

FIG. 1 schematically illustrates a part of a first embodiment of a probe 10 having four cantilever arms designated the reference numeral 12 and a contact detector 14. The cantilever arms 12 and the contact detector 14 extend from the probe 10 over an edge 16 of a surface 18 of the probe 10.

The contact detector may be used for detecting obstacles, deformations on or in the surface of the test sample, or simply detection of contact between the probe and the surface of the test sample.

The cantilever arms 12 extend freely, and substantially parallel, from the edge 16. The contact detector 14 also extends freely from the edge 16. The contact detector shown is in the form of a cantilever structure with a flexible arm 21. The flexible arm 21 extends substantially parallel to the cantilever arms 12.

The flexible arm 21 is attached to the probe 10 via the anchoring arms 20 and 22. These arms are coated with a conductive and non-piezoresistive metallic layer, so that they may function as a strain gauge sensor for detecting the deflection of the contact detector.

The flexible arm 21 is electrically connected in a Wheatstone bridge circuit 24 used to detect changes in voltage/resistance as a result of the deflection of the flexible arm 21. As in any Wheatstone configuration, the circuit 24 comprises three resistors with known resistance. The resistance of the strain gauge part established at the arms 20 and 22 of the flexible arm 21 is used as a measure for the deflection of the flexible arm 21. The strain gauge is established by a non-piezoresistive metal layer on a supporting silicon layer or structure. The silicon layer also constitutes the supporting body, i.e. the probe body 10.

The advantage of using a non-piezoresistive metal layer, or a non-piezoresistive electrical pathway, in the flexible arm 21 of the contact detector 14 can easily be explained from FIG. 1. In order to simplify matters, a coordinate system is established in FIG. 1, with the z-axis parallel to the normal of the paper surface, the y-axis parallel to the flexible arm 21 and in the surface of the paper, and the x-axis perpendicular to the flexible arm 21 and in the surface of the paper. Assume that a force along the z-axis is acting on the tip of the flexible arm 21, which will cause the flexible arm 21 to deflect. Depending on what side of the supporting body the metal coating is on, the deflection will either compress or elongate the coating. For the case of a compressed coating, the cross-section of the conducting metal will increase, while the length of the conducting path will decrease. Both of these effects will result in a decrease of resistance. For the case of an elongated coating, the cross-section of the conducting metal will decrease, while the length of the conducting path will increase, which will lead to an increase of the resistance.

Assume instead that a force along the x-axis is acting on the tip of the flexible arm 21 from the right in FIG. 1. Due to the induced moment, the anchoring arm 20 will be subjected to a compression, while the other anchoring arm 22 will be subjected to an elongation. Compared with the unaffected contact detector, the resistance will decrease when following the electrical path through the first anchoring arm 20 to the flexible arm 21, while it will increase when going back from the flexible arm 21 through the anchoring arm 22. This follows from the fact that the applied force will cause the cross-section of the first anchoring arm 20 to increase, while the cross-section at the second anchoring arm 22 will decrease. Further, the length of the first anchoring arm 20 will decrease, while the length of the second anchoring arm 22 will increase. At moderate deflections, both the changes in cross-section and the changes in length will counteract one another, resulting in an electrical resistance of the contact detector circuit 24 that, to a good approximation, remain unchanged. However, if the anchoring arms 20 and 22 were of a piezoresistive material, due to the non-linearity of the resistance with respect to the applied force, the resistance of the contact detector circuit 24 would change significantly, even at moderate deflections of the flexible arm 21. Hence, in order to avoid a detection signal originating from a force component along the x-axis, a contact detector based on the principles put forward here should have the anchoring arms 20 and 22 of a non-piezoresistive material. It should also be noted that the contact detector in FIG. 1 is insensitive to a force component along the y-axis. This follows from that fact the flexible arm 21 will not, in this situation, work as a lever to create a length dependent moment at the base of the arm.

The embodiment shown in the figures include a Wheatstone bridge near or at the contact structure, i.e. on top of the body of the probe 10. In other embodiments, the circuit may be placed remotely, e.g. in a test apparatus or the like, or just at a different part of the probe 10.

The contact detector 14 serves a supplementary purpose, namely as an error function. If the flexible arm 21 breaks off, the electrical path defined via the anchoring arms 20 and 22 will be disconnected and thus the resistance will increase to infinity, or at least very high.

If the flexible arm 21 of the contact detector 14 is brought into contact with the surface of the test sample, the electrical resistance of the strain gauge will change. When the electrical resistance, or the relative change in the electrical resistance, of the strain gauge exceeds a predefined value, the system will terminate the probe movement. In case the contact detector breaks at the anchoring arms 20 or 22 the resistance increases significantly in comparison to an almost balanced Wheatstone bridge. The system then aborts the measurement to prevent the probe to run into the surface.

Figure 2:
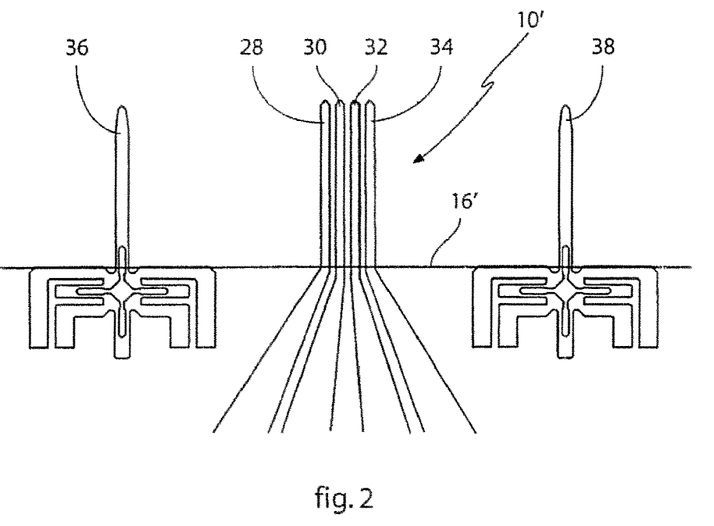

FIG. 2 schematically illustrates a second embodiment of a probe 10' having a plurality, i.e. four, cantilever arms 28, 30, 32, 34, where each arm includes an electrically conductive tip for establishing electrical contact with an area of a surface of a test sample.

The probe 10' further includes two contact detectors 36 and 38. The contact detectors 36, 38 are of the same type as described with reference to FIG. 1.

Figure 3:
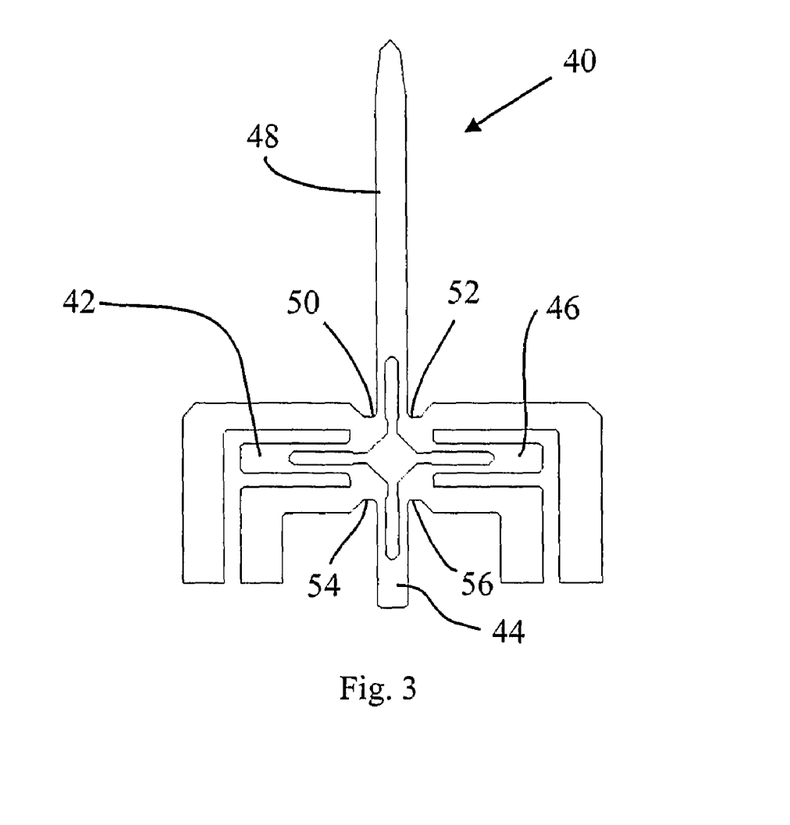

FIG. 3 schematically illustrates a sketch of a strain gauge in a Wheatstone bridge configuration. The Wheatstone bridge is constituted by three resistors 42, 44 and 46 all with a non-variable resistance. The resistance may change with temperature, but it is not generally variable. The flexible arm 48 comprises a strain gauge element constituted by the metal layer constituting the electrical circuit.

In one embodiment of the present invention, a current is applied between points 50 and 54. The output voltage between the points 52 and 56 is monitored continuously during engage, i.e. while the probe is in contact with the surface of the test sample.

Prior to the engagement a reference value is measured, defined as Vref. To calculate the relative change in the output value, an output voltage is measured between points 50 and 52, defined as Vo, when applying a current between points 54 and 56.

By continuously monitoring the relative change in the output voltage, given by:

$$(V_{out}-V_{ref})/V_o$$

is it possible to detect the contact point for the cantilever having the strain gauge element. This may be done as follows. Directly following that the probe is moved towards the surface, when the relative changes in the output voltage exceed a predefined value, the system will terminate the engage of the strain gauge. In case the cantilever of the strain gauge breaks the resistance will increase significantly in comparison to an almost balanced Wheatstone bridge. The system will then simply abort the measurement to prevent the probe to run into the surface.

Figure 4:
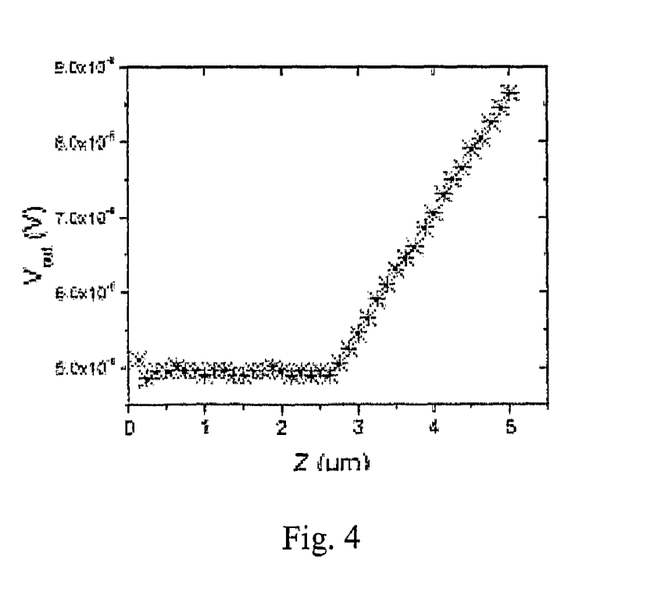

FIG. 4 schematically illustrates measured output voltage of a Wheatstone bridge as a function of the displacement of the strain sensor, i.e. surface detector, in one dimension, i.e. along the Z-axis. The current set-point is 500 µA. Before detecting the sample surface, a constant output voltage is obtained. As soon as the tip of the cantilever is in contact with a surface, a force is exerted to the cantilever, which induces a strain in the sensor, consequently a change in the output voltage. A linear dependence of the z movement of the cantilever on the output voltage is observed, which is expected due to the use of non-piezoresistive materials in the circuitry.

Figure 5:
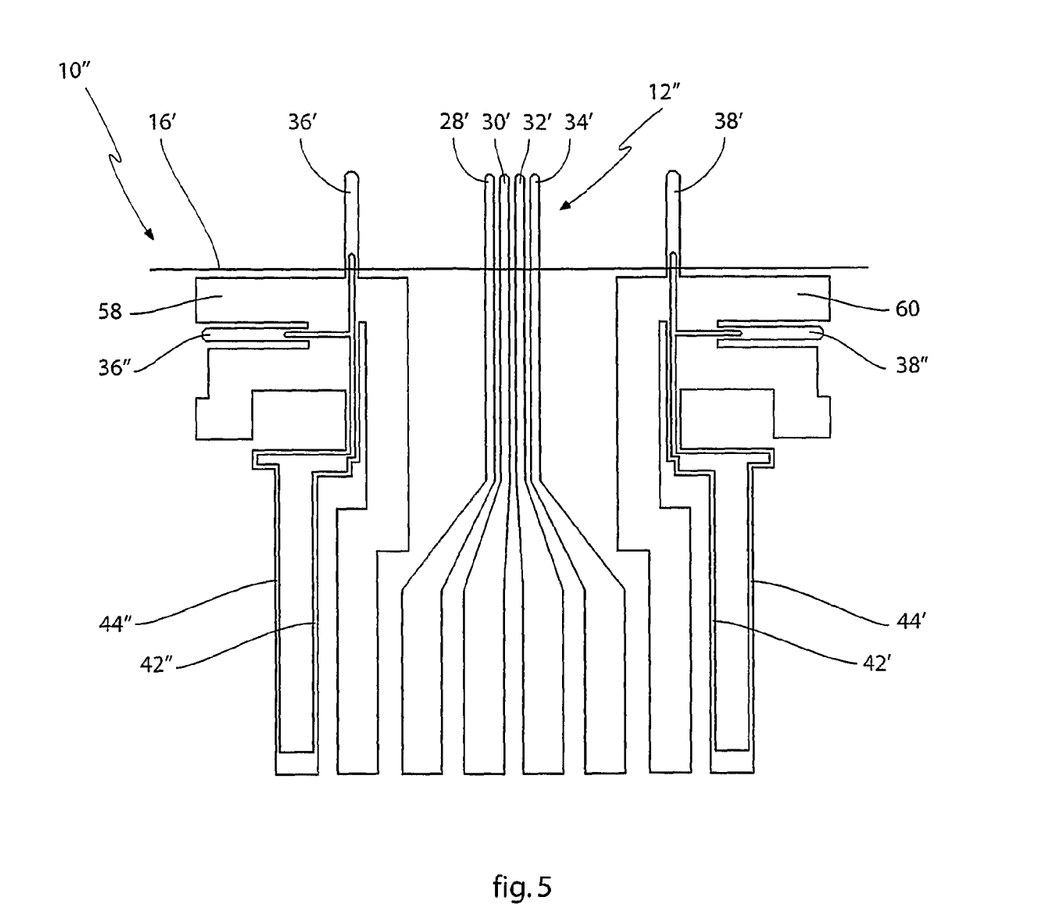

FIG. 5 schematically illustrates a third embodiment of a probe 10". The third embodiment 10" of the probe differs from the above-described second embodiment shown in FIG. 2 in that the resistor, constituting a first branch of the Wheatstone bridge also including the contact detector is substituted by a replica of the contact detector itself. The contact detectors located at the left and right hand side of the cantilever arms 28', 30', 32' and 34' are designated the reference numerals 36' and 38' and the replica contact detectors connected in a series configuration with the contact detectors are designated the reference numerals 36" and 38". The two replica contact detectors 36" and 38" are located in respective recesses within the substrate, which recesses are designated the reference numerals 58 and 60, respectively, serving to protect the replica contact detectors 36" and 38" from being contacted with the surface of the test sample. The replica contact detectors consequently constitute reference detectors of the same resistance as the contact detectors consequently ensuring a high degree of accuracy, as the first branch of the Wheatstone bridge in each of the two Wheatstone bridges is constituted by identical resistive elements, one of which is a contact detector, which is exposed to mechanical bending for causing the anchoring arms of the contact detector to change their resistivity for detecting the establishing of contact between the contact detector and the surface of the test sample, as is readily described above.

The Wheatstone bridges belonging to the two contact detectors 36' and 38' further comprise sets of reference resistors 42', 44' and 42", 44", respectively, constituting a second branch of the Wheatstone bridge of each of the two contact detectors 36' and 38'.

The third embodiment shown in FIG. 5 basically provides the highly advantageous integration of identical resistors of the first branch of the Wheatstone bridges, as the contact detectors 36' and 38' are replicated into dummy resistors 36" and 38", respectively, firstly ensuring a high degree of identity between the properties of the measuring contact detector and the dummy contact detector of the two Wheatstone bridges and secondly provides a highly simple technique of producing the probe by simply replicating the contact detectors as identical reference detectors of the Wheatstone bridges.

Although the present invention has above been described with reference to specific and advantageous embodiments, it is evident to a person having ordinary skill in the art that numerous modifications and amendments may be made without departing from the scope of the present invention as defined in the appending patent claims.

The invention claimed is:

1. A probe for determining an electrical property of an area of a surface of a test sample, said probe intended to be in a specific orientation relative to said test sample, said probe comprising:
   a supporting body defining a first surface,
   a plurality of cantilever arms extending from said supporting body in co-planar relationship with said first surface, said plurality of cantilever arms extending substantially parallel to each other, each of said plurality of cantilever arms including an electrical conductive tip for contacting said area of said test sample by movement of said probe relative to said surface of said test sample into said specific orientation, and
   a contact detector extending from said supporting body arranged so as to contact said surface of said test sample prior to or simultaneously with any one of said plurality of cantilever arms contacting said surface of said test sample when performing said movement, where said contact detector is a strain gauge sensor comprising:
   a flexible arm having a base split into two anchoring arms, and
   an electrical pathway of a non-piezoresistive material going out through one of said anchoring arms to said flexible arm and back through the other of said anchoring arms.

2. The probe according to claim 1, wherein said probe further includes an electrical detection circuit for detecting a signal change in said contact detector.

3. The probe according to claim 2, wherein said surface of said test sample is detected by a mechanism that measures deflection of said flexible arm.

4. The probe according to claim 2, wherein said electrical detection circuit comprises a circuit selected from the group consisting of a Wheatstone bridge and a four-wire ohm circuit.

5. The probe according to claim 1, wherein said contact detector extends at a specific angle relative to said plurality of cantilever arms.

6. The probe according to claim 5, wherein said specific angle is selected from the group consisting of 0 degrees, 45 degrees and 90 degrees.

7. The probe according to claim 1, wherein the said plurality of cantilever arms extend so as to define a first length from said body, said contact detector extending from said body so as to define a second length, being different from said first length.

8. The probe according to claim 7, wherein the second length of the contact detector constitutes an overall length of the contact detector along a longitudinal direction of the contact detector, wherein the flexible arm split defines an arm split aperture defining an arm split length along the longitudinal direction, and wherein the arm split length constitutes between 10% and 99% of the second length.

9. The probe according to claim 7, wherein at least one of the first length and the second length is of the order of 1 µm-1000 µm.

10. The probe according to claim 1, wherein said plurality of cantilever arms defines a common plane.

11. The probe according to claim 10, wherein said contact detector is on a second planar surface, said second surface being in said common plane or said second surface being in a plane displaced parallel to said common plane.

12. The probe according to claim 1, wherein said contact detector is positioned between said cantilever arms.

13. The probe according to claim 1, wherein said probe comprises two contact detectors positioned parallel so that said plurality of cantilever arms are positioned between said two contact detectors.

14. The probe according to claim 1, further including a reference detector concealed by said supporting body for preventing the reference detector from being contacted with the surface of the test sample.

15. The probe according to claim 4, wherein the contact detector is included in a first branch of a Wheatstone bridge, and wherein the probe further includes reference resistors constituting a second branch of the Wheatstone bridge, the resistance of the first branch being smaller than the resistance of the second branch and being at least two times smaller than the resistance of the second branch.

16. A method of obtaining an electrical property of a test sample, said method comprising:
    (a) providing said test sample, said test sample defining a test surface,
    (b) providing a test apparatus including a probe for determining an electrical property of an area of a surface of a test sample, said probe intended to be in a specific orientation relative to said test sample, said probe comprising:
    a supporting body defining a first surface,
    a plurality of cantilever arms extending from said supporting body in co-planar relationship with said first surface, said plurality of cantilever arms extending substantially parallel to each other, each of said plurality of cantilever arms including an electrical conductive tip for contacting said area of said test sample by movement of said probe relative to said surface of said test sample into said specific orientation, and
    a contact detector extending from said supporting body arranged so as to contact said surface of said test sample prior to or simultaneously with any one of said plurality of cantilever arms contacting said surface of said test sample when performing said movement,
    said apparatus further comprising an electrical signal generator electrically connected to said electrical conductive tips of said probe,
    (d) providing a contact detection circuit electrically connected to said contact detector,
    (e) moving said probe relative to said surface of said test sample, and
    (f) monitoring said contact detection circuit for indication of said contact detector being in contact with said surface of said test sample, where said contact detector is a strain gauge sensor comprising:
    a flexible arm having a base split into two anchoring arms, and
    an electrical pathway of a non-piezoresistive material going out through one of said anchoring arms to said flexible arm and back through the other of said anchoring arms.

17. A system for determining an electrical property of an area of a surface of a test sample, said system comprising:
    a test sample holder for holding said test sample,
    a probe holder for holding a probe for determining an electrical property of an area of a surface of a test sample, said probe intended to be in a specific orientation relative to said test sample, said probe comprising:
    a supporting body defining a first surface,
    a plurality of cantilever arms extending from said supporting body in co-planar relationship with said first surface, said plurality of cantilever arms extending substantially parallel to each other, each of said plurality of cantilever arms including an electrical conductive tip for contacting said area of said test sample by movement of said probe relative to said surface of said test sample into said specific orientation, and
    a contact detector extending from said supporting body arranged so as to contact said surface of said test sample prior to or simultaneously with any one of said plurality of cantilever arms contacting said surface of said test sample when performing said movement,
    said system further comprising an electrical signal generator electrically connected to said electrical conductive tips of said probe, and a contact detection circuit electrically connected to said contact detector,
    wherein the movement of said probe relative to said surface of said test sample said contact detection circuit detects an indication of said contact detector being in contact with said surface of said test sample, wherein said contact detector is a strain gauge sensor comprising:
    a flexible arm having a base split into two anchoring arms, and
    an electrical pathway of a non-piezoresistive material going out through one of said anchoring arms to said flexible arm and back through the other of said anchoring arms.

* * * * *